United States Patent
Yang et al.

(10) Patent No.: US 10,886,168 B2
(45) Date of Patent: Jan. 5, 2021

(54) SURFACE MODIFIED DIELECTRIC REFILL STRUCTURE

(71) Applicant: International Business Machines Corporation, Armonk, NY (US)

(72) Inventors: Chih-Chao Yang, Glenmont, NY (US); Terry A. Spooner, Mechanicville, NY (US); Koichi Motoyama, Clifton Park, NY (US); Shyng-Tsong Chen, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/430,926

(22) Filed: Jun. 4, 2019

(65) Prior Publication Data

US 2020/0388524 A1   Dec. 10, 2020

(51) Int. Cl.
*H01L 21/02* (2006.01)
*H01L 21/768* (2006.01)
(Continued)

(52) U.S. Cl.
CPC .... *H01L 21/7682* (2013.01); *H01L 21/02063* (2013.01); *H01L 21/76814* (2013.01);
(Continued)

(58) Field of Classification Search
CPC ........... H01L 21/7682; H01L 21/02063; H01L 21/76814; H01L 21/76843;
(Continued)

(56) References Cited

U.S. PATENT DOCUMENTS 6,291,343 B1   9/2001   Tseng et al.
6,902,987 B1   6/2005   Tong et al.
(Continued)

FOREIGN PATENT DOCUMENTS

EP   1275142 A1   1/2003

OTHER PUBLICATIONS

C. S. Tan et al., "Low Temperature Wafer Bonding of Low-κ Carbon-Doped Oxide for Application in 3D Integration," Electrochemical and Solid-State Letters, vol. 13, No. 2, 2010, pp. H27-H29.

(Continued)

*Primary Examiner* — Tong-Ho Kim
(74) *Attorney, Agent, or Firm* — Cantor Colburn LLP; Robert Sullivan

(57) ABSTRACT

Back end of line (BEOL) structures and methods generally includes forming at least two adjacent conductors separated by a space formed in a first dielectric material, wherein a liner layer is intermediate the first dielectric material and each of the at least two adjacent conductors. A second dielectric material in the space between the at least two adjacent conductors and in contact with the first dielectric material at a bottom surface thereof, wherein the first dielectric material is different from the second dielectric material, and wherein the first dielectric material has a nitrogen enriched surface at an interface between the first dielectric material and the second dielectric material. The nitrogen enriched surface can be formed by plasma nitridation, thermal nitridation, or laser annealing in the presence of nitrogen gas, ammonia, or a combination thereof.

20 Claims, 3 Drawing Sheets

(51) Int. Cl.
*H01L 23/522* (2006.01)
*H01L 23/532* (2006.01)

(52) U.S. Cl.
CPC .. *H01L 21/76843* (2013.01); *H01L 21/76877* (2013.01); *H01L 23/5226* (2013.01); *H01L 23/5329* (2013.01); *H01L 23/53238* (2013.01)

(58) Field of Classification Search
CPC ........... H01L 21/76877; H01L 23/5226; H01L 23/53238; H01L 23/5329
USPC ....................................................... 257/751
See application file for complete search history.

(56) References Cited

U.S. PATENT DOCUMENTS

| | | | |
|---|---|---|---|
| 8,133,810 B2 | 3/2012 | Yang et al. | |
| 8,138,604 B2 | 3/2012 | Yang et al. | |
| 9,054,048 B2 | 6/2015 | Liu et al. | |
| 9,786,603 B1 | 10/2017 | Clevenger et al. | |
| 2004/0232552 A1* | 11/2004 | Wang | H01L 21/7682 257/758 |
| 2008/0120580 A1* | 5/2008 | Hsu | H01L 21/76849 257/751 |
| 2014/0332964 A1* | 11/2014 | Yang | H01L 23/5329 257/762 |

OTHER PUBLICATIONS

C. Ventosa et al., "Mechanism of thermal silicon oxide direct wafer bonding," Electrochemical and Solid-State Letters, vol. 12, No. 10, 2009, pp. H373-H375.

K. Warner et al., "Low-temperature oxide-bonded three-dimensional integrated circuits," Proceedings of the IEEE International SOI Conference, 2002, pp. 123-125.

M. Eichler et al., "Effects on silanol condensation during low temperature silicon fusion bonding," Journal of the Electrochemical Society, vol. 156, No. 10, 2009, pp. H786-H793.

* cited by examiner

SURFACE MODIFIED DIELECTRIC REFILL STRUCTURE

BACKGROUND

The present invention generally relates to semiconductor integrated circuits, and more particularly, to surface modified dielectric refill structure.

Integrated circuit processing can be generally divided into front end of the line (FEOL), middle of the line (MOL) and back end of the line (BEOL) metallization processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL metallization processing to complete the integrated circuit structure. As such, BEOL metallization processing generally involves the formation of insulators and conductive wiring. Often, the BEOL metallization process can further include fabrication of magnetoresistive random access memory (MRAM) devices, capacitors, resistors and the like. Current BEOL processes include removal of the dielectric material between adjacent conductors followed by refill with a second dielectric material.

SUMMARY

Embodiments of the present invention are generally directed to semiconductor structures including one or more back end of the line metallization layers and methods of fabrication. A non-limiting example of the semiconductor structure including a back end of line (BEOL) metallization structure includes at least two adjacent conductors separated by a space formed in a first dielectric material. A liner layer is intermediate the first dielectric material and each of the at least two adjacent conductors. A second dielectric material is provided in the space between the at least two adjacent conductors and is in contact with the first dielectric material at a bottom surface thereof. The first dielectric material is different from the second dielectric material and has a nitrogen enriched surface at an interface between the first dielectric material and the second dielectric material.

A non-limiting example of a back end of line (BEOL) dielectric removal and refill process between adjacent conductors according to embodiments of the invention includes removing a first dielectric material between adjacent conductors to form an opening exposing liner layers on sidewalls of the adjacent conductors and the first dielectric material at a bottom of the opening. The exposed top surfaces of the adjacent conductors, the exposed liner layer on the sidewalls of the adjacent conductor, and the exposed first dielectric material at the bottom of the opening are nitrided to form nitrogen enriched surfaces. The nitrogen enriched surface on the top surfaces of the adjacent conductors are selectively removed. The opening between the adjacent conductors is filled with a second dielectric material, wherein the first dielectric material is different from the second dielectric material.

A non-limiting example of a back end of line (BEOL) dielectric removal and refill process between adjacent conductors according to embodiments of the invention includes removing a first dielectric material between at least two adjacent conductors to form an opening therebetween exposing liner layers on sidewalls of the adjacent conductors and the first dielectric material at a bottom of the opening. Exposed top surfaces of the at least two adjacent conductors, the exposed surface of the liner layer on the sidewalls abutting the opening, and the exposed surfaces of the first dielectric material at the bottom of the opening are nitrided to form nitrogen enriched surfaces. The nitrogen enriched surface on the exposed top surfaces of the at least two adjacent conductors and the exposed surfaces of the liner layer are removed by exposure to a reactive pre-clean process. The opening between the adjacent conductors is filled with a second dielectric material, wherein nitrogen enriched surfaces of the first dielectric material are in contact with the second dielectric material. The first dielectric material is different from the second dielectric material.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

PRIOR ART

DETAILED DESCRIPTION

The present invention generally relates to structures and processes that include removal of the dielectric material between conductors followed by refill with a second dielectric material. Prior processes and structures resulted in damage to both the liner layer on the sidewalls of the conductor as well as the exposed surfaces of an underlying dielectric material, both of which can contain chemical residues as a function of the removal process.

Figure 1:
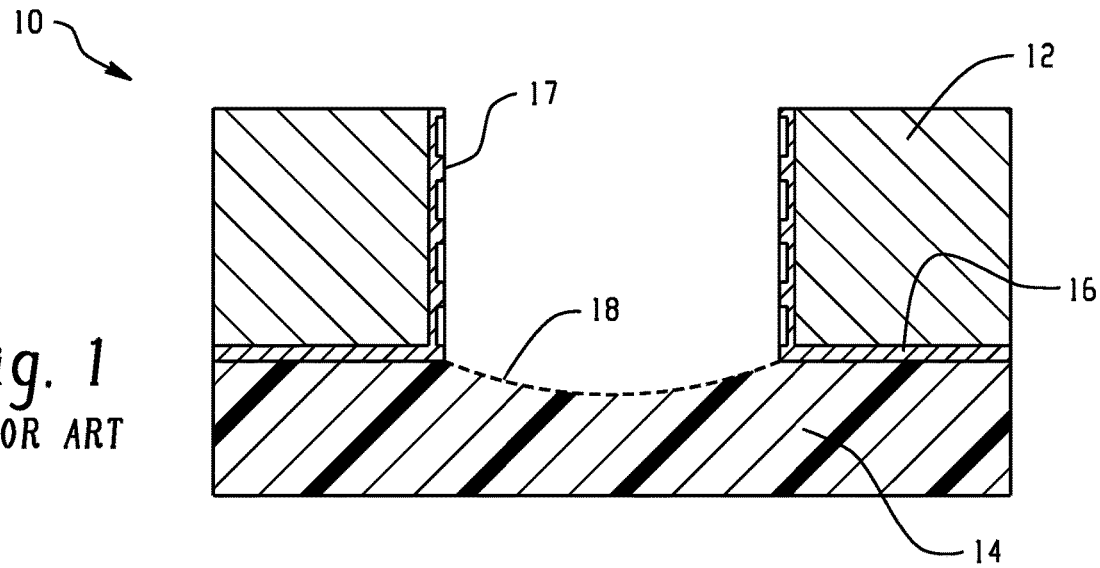
FIG. 1 depicts a cross section of a prior art back end of line structure subsequent to dielectric material removal between adjacent conductors.

Prior art represented by FIG. 1 illustrates a typical back end of line structure 10 subsequent to dielectric material removal between adjacent conductors 12. The back end of the line structure 10 includes an underlying dielectric layer 14 upon which adjacent conductors 12 (e.g., metal lines) are formed using lithographic processing. The conductors 12 include a liner layer 16 about the surface thereof to prevent electromigration of the conductor into the dielectric material. The dielectric material 14 between adjacent conductors 12 is removed using a selective wet or dry etch process. As shown, damage during the dielectric material removal step has been found to occur to the exposed surfaces 17 of the liner layer 16, which affects the integrity of the liner layer 16 and makes the structure prone to electromigration during subsequent processing steps, which can directly affect device yield. Additionally, damage is evident in the exposed surface 18 of the underlying dielectric layer 14, which can affect bonding strength of the refilled dielectric material with the underlying dielectric material 14. As will be described in greater detail below, surface treatment has been found to reduce the damage that occurs during the dielectric material removal step between the adjacent conductors and improves the mechanical integrity of the resulting structure. In particular, bonding strength of the refilled dielectric material to the underlying dielectric material 14 is increased.

It is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOS technology, MOSFET devices, and/or FinFET devices. By way of non-limiting example, the semiconductor devices can include, but are not limited to MOSFET and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments of the invention, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Figure 2:
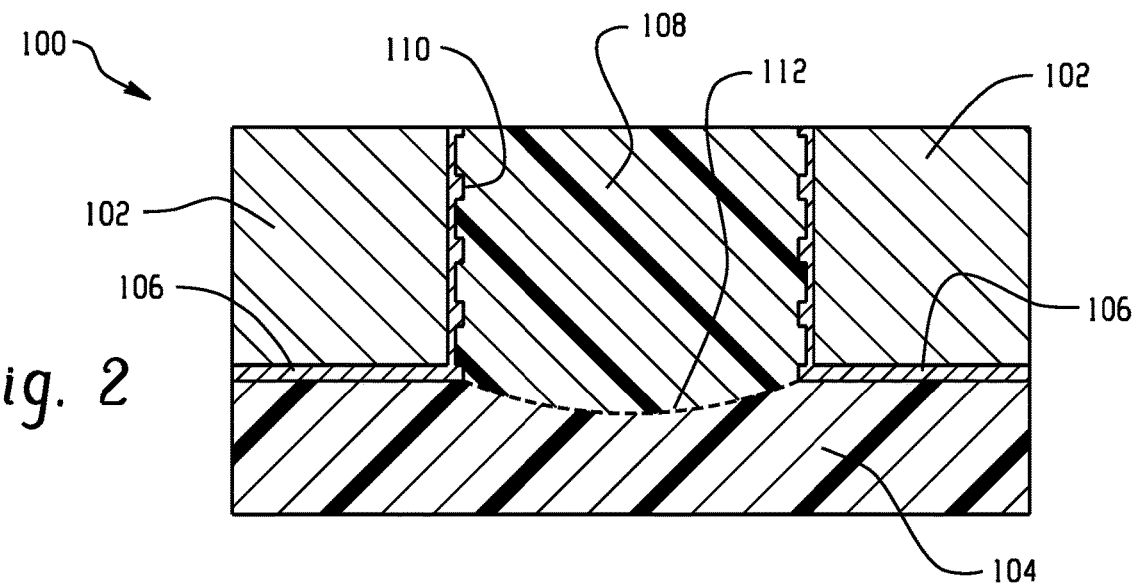
FIG. 2 depicts a cross section of a back end of line structure subsequent to removal of a first dielectric material between adjacent conductors and refill with a second dielectric material in accordance with one or more embodiments of the present invention.

Turning now to a more detailed description of aspects of the invention, FIG. 2 schematically illustrates a back end of line structure 100 in accordance with the present invention including adjacent conductors 102 lithographically formed in a first dielectric layer 104, a liner layer 106 on sidewalls and a bottom surface of the conductors 102, and a refilled second dielectric material 108 formed between the adjacent conductors 102 subsequent to selective removal of a first dielectric material 104 that had been provided between the adjacent conductors 102, wherein the first and second dielectric materials 104, 108, respectively, are different. Additionally, the exposed surfaces 110, 112 of the liner layer 106 and the first dielectric material 104 subsequent to removal thereof and prior to refill with the second dielectric material 108, respectively, are treated using a direct plasma nitridation process to form nitrided surfaces 110, 112 (i.e., nitrogen enriched surfaces) in the exposed liner layer 104 and the exposed first dielectric material 104, respectively. The resulting nitrided surfaces increases the dielectric-dielectric bonding of the refilled second dielectric material 108 to the underlying first dielectric material 104 by 50% or more compared to the prior art structures, thereby providing a marked increase in mechanical integrity. Optionally, a reactive pre-clean process can be used to selectively remove the nitrided surfaces from the top surfaces of the conductors and the liner layer 106 on sidewalls abutting the opening formed subsequent to removal of the first dielectric material 104.

Figure 3:
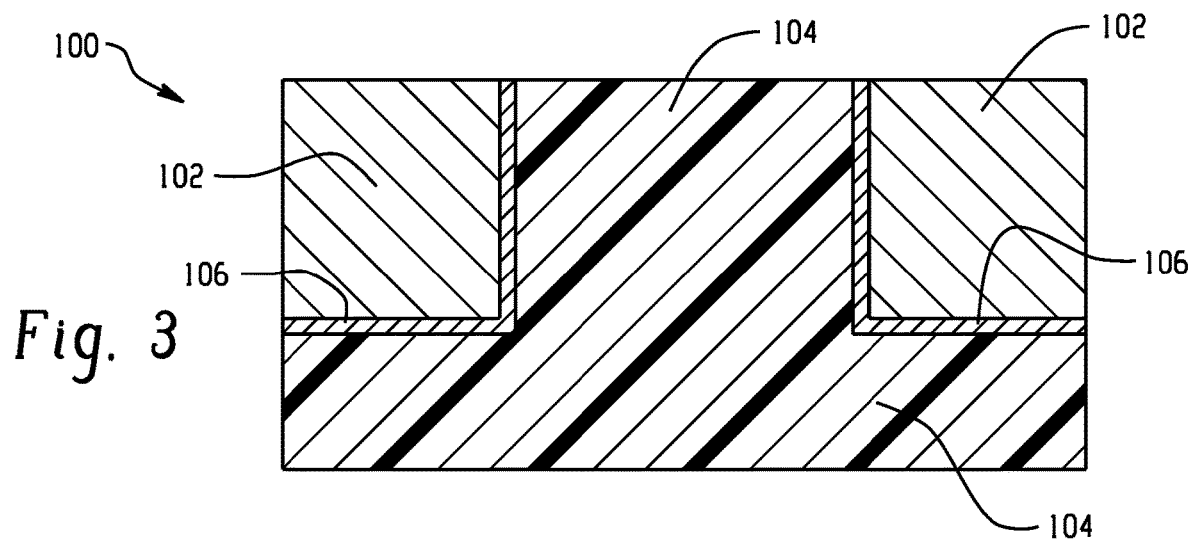
FIG. 3 depicts a cross section of a back end of line structure subsequent to formation of adjacent conductors in a first dielectric material in accordance with one or more embodiments of the present invention.

Turning now to FIGS. 3-6, there is shown an exemplary process for forming the structure 100. In FIG. 3, there is shown a portion of an integrated circuit including a BEOL structures 100 including the patterned first dielectric layer 104, e.g., an interlayer dielectric, a liner layer 106 conformally formed on the dielectric layer 102, and adjacent conductors 102, e.g., lines, formed on the liner layer 106.

The patterned first dielectric layer 104 can be $SiO_2$, SiC, SiN, SiC(N, H) or any low k (i.e., k value less than 3.0) including inorganic or organic dielectrics. The dielectric material can be porous or non-porous. Some examples of suitable dielectrics that can be used as the dielectric material include, but are not limited to: $SiO_2$, silsesquioxanes, carbon doped oxides (i.e., organo silicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The patterned dielectric layer 102 can be deposited by PECVD procedures as is generally known in the art.

The adjacent conductors 102 can be any suitable conductor, including, but not limited to, copper, aluminum, tungsten, cobalt, ruthenium, alloys thereof, and mixtures thereof. In some structures, copper can be used and can include one or more alloying elements such as C, N, O, Cl, S, Mn, Al, etc. which have been shown to improve the reliability of the copper conductor. The amount of alloying element in the copper alloy is typically in the range of about 0.001 weight percent (wt. %) to about 10 wt %).

The conductors 102 can be formed by CVD, PVD (sputtering), electrochemical deposition or like processes. For example, the deposition of copper can be done by electroplating or electroless plating as are known in the art.

Optionally, a conformal seed layer (not shown) can be deposited prior to deposition of the conductor 102. The function of the seed layer is to provide an adhesive base upon which the metal conductor 102 can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments of the invention, the deposited seed layer will contain from about 1 atomic percent to about 7 atomic percent. Examples of seed layers are copper, copper manganese, and the like.

The liner layer 106 can be formed using conventional deposition processes, such as, for example, CVD, atomic layer deposition (ALD), physical vapor deposition (PVD), plasma enhanced chemical vapor deposition (PECVD), or the like. In one or more embodiments, the liner layer 106 can be formed of a metal such as Ta, Ti, Ru, Jr, Co, and/or W, and/or a metal nitride thereof such as TaN, TiN, CoN, RuN, and WN, combinations thereof, single or multiple layers, and alloys thereof. In one or more embodiments, the deposition of the liner layer 106 can include a nitrogen gradient so as to form the corresponding nitride in an upper portion of the liner layer 106. For example, deposition of tantalum can be conformally formed on the first dielectric material 104 to form a tantalum layer followed by introduction of a nitrogen source into the reactor to form tantalum nitride on the tantalum portion. In one or more embodiments, the liner layer 106 can range from 0.05 nm to 25 nm. In one or more other embodiments, the thickness of liner layer can range from 0.1 nm to 10 nm, and in still one or more other embodiments, the thickness of liner layer can range from 1 nm to 5 nm.

Typically, the integrated circuit is subjected to a planarization process subsequent to deposition of the conductors 102, which usually includes the formation of an overburden. By way of example, the surface can be planarized using an electropolishing process. In an electropolishing process, small amounts of metal are etched by electroetch or electrochemical etching to provide the conductor 102 with a top metal surface generally coplanar to the top surface of the patterned first dielectric 104. In another embodiment, the planar surface is formed by chemical mechanical polishing (CMP). The CMP process planarizes the surface of the interconnect structure by a combination of chemical and mechanical etching using multi-step polishing with selective and non-selective slurry compositions generally known in the art. Alternatively, a planar surface can be formed by a non-selective plasma etching process, termed "etchback". The etchback process can include additional planarizing layers deposited onto metal layer. For example, a layer of photoresist can be deposited onto metal layer prior to performing the non-selective etch process.

Figure 4:
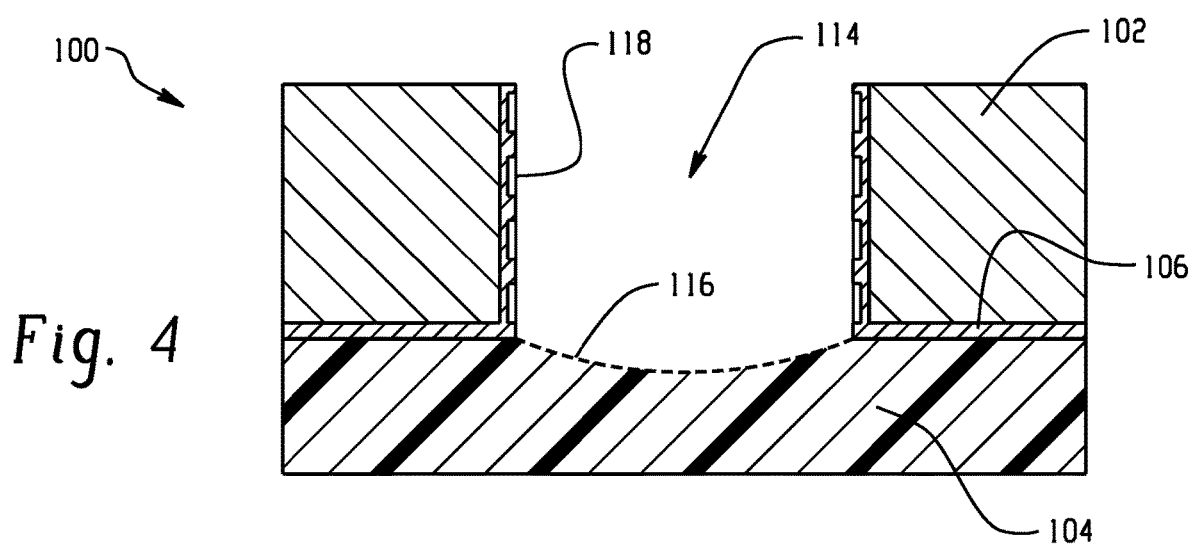
FIG. 4 depicts a cross section of the back end of line structure of FIG. 3 subsequent to removal of the first dielectric material between the adjacent conductors in accordance with one or more embodiments of the present invention.

FIG. 4 schematically illustrates the structure 100 of FIG. 3 subsequent to selective removal of the first dielectric material 104 between the adjacent conductors 102 to form an opening 114 therebetween. Selective removal can be effected using a dry etch, a wet etch or combinations thereof. By way of example, reactive ion etch can be used to selectively remove the dielectric material 104 between the adjacent conductors or removal can be effected using a wet etch including a dihydrofuran solvent or a combination of the reactive ion and wet etch. During the dielectric removal process, the surfaces 118 of the liner layer 106 abutting the opening 114 and the first dielectric material at the bottom 116 of the opening 114 are damaged, which can include physical roughness and/or the presence of chemical residues.

Figure 5:
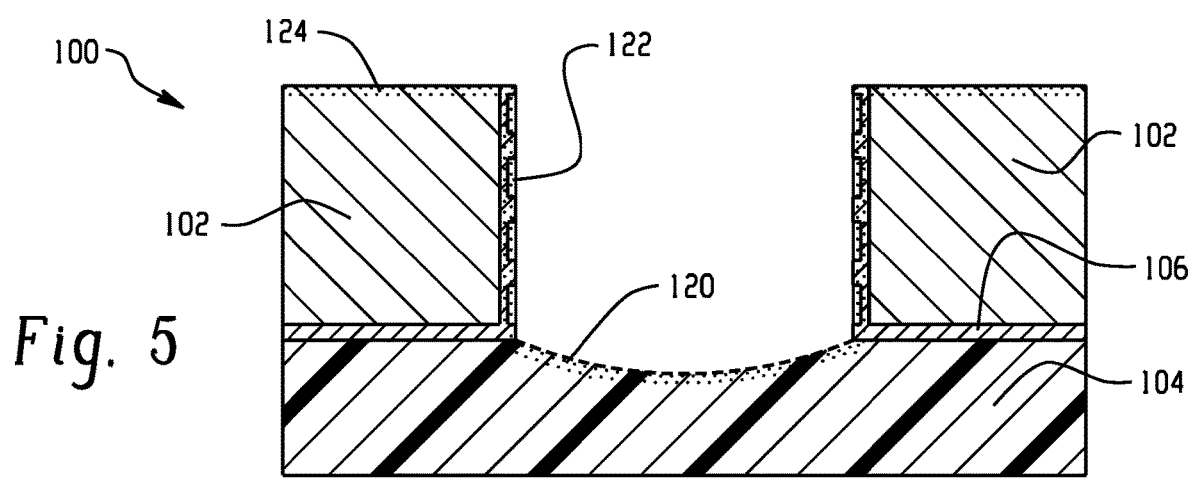
FIG. 5 depicts a cross section of the structure of FIG. 4 subsequent to nitridation of exposed surfaces to form nitrogen enriched surfaces in accordance with one or more embodiments of the present invention.

FIG. 5 schematically illustrates the structure 100 of FIG. 4 subsequent to nitridation of the exposed surfaces. In this step, the surfaces 116, 118 are exposed to nitrogen ions generated from a nitrogen-containing gas to form a nitrogen enriched first dielectric layer 120 and a nitrogen enriched liner layer 122. Additionally, the top surfaces 124 of the conductors 102 are nitrided. The generation of the nitrogen ions can be plasma or thermally generated, wherein the nitrogen ions penetrate into at least a portion of the exposed first dielectric layer 104 to form the nitrogen enriched first dielectric layer 120 and the liner layer 106 to form the nitrogen enriched liner layer 122.

As defined herein, the nitrogen-containing gas is selected from the group consisting of nitrogen ($N_2$) and ammonia ($NH_3$). Upon exposure to a suitable energy source, the nitrogen or ammonia dissociates to form nitrogen ions, which are then utilized to enrich a contact surface such as the exposed surfaces of the dielectric layer with nitrogen ions. Suitable energy sources include, but are not limited to, plasma energy sources and thermal energy sources.

Plasma nitridization generally includes exposing the nitrogen-containing gas to a plasma energy source effective to generate the nitrogen ions from the nitrogen containing gas. The substrate including the exposed dielectric layer surfaces of the trench and via are then exposed to the nitrogen ions to form a nitrogen enriched surface that also penetrates the respective surface to form a nitrogen enriched gradient in the dielectric layer. The process temperature is between about 80° C. to about 400° C., for about 10 seconds to about 10 minutes and the bias is typically between 100 to 900 W.

Thermal nitridization provides a similar effect as plasma nitridization but generally includes exposing the substrate to a temperature effective to generate nitrogen ions from the nitrogen containing gas. Again, the nitrogen ions contact and penetrate the exposed surface of the first dielectric layer 104 and liner layer 106 so as to form a nitrogen enriched surfaces 120, 122, respectively. The process temperature is generally between about 80° C. to 400° C. for about 20 minutes to about 4 hours.

Still further, a laser anneal process can be utilized to form the nitrogen enriched surfaces 120, 122. The laser anneal process generally includes exposing the surfaces in the presence of nitrogen and/or ammonia at a temperature of about 300° C. to about 1000° C. for a few nanoseconds to about 5 seconds.

Figure 6:
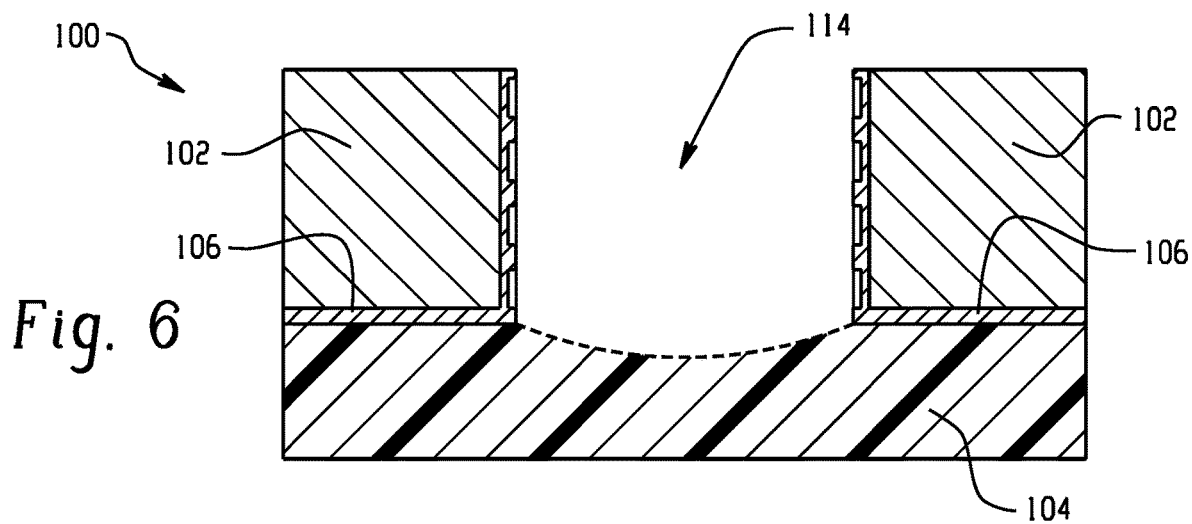
FIG. 6 depicts a cross section of the structure of FIG. 5 subsequent to selective removal of the nitrogen enriched surfaces from the conductor and liner layer in accordance with one or more embodiments of the present invention.

As shown in FIG. 6, an optional plasma treatment such as a reactive pre-clean process can then be performed to selectively remove the nitride from nitrogen enriched surfaces 122 of the liner layer 106 and from the top surfaces 124 of the conductors 102. The process gases forming the plasma can include, but are not limited to, $H_2$, forming gas, $O_2$ and combinations thereof and a carrier gas. The carrier gases preferably include inert gases, He, Ne, Ar, Kr, Xe and Rn, and combinations thereof. The process conditions preferably include a temperature of between about room temperature and about 450° C., a pressure of between about 0.5 mtorr and about 100 torr, an RF power of between about 50 W and about 5 KW, and a process time of between about 5 seconds and about 600 seconds.

Figure 7:
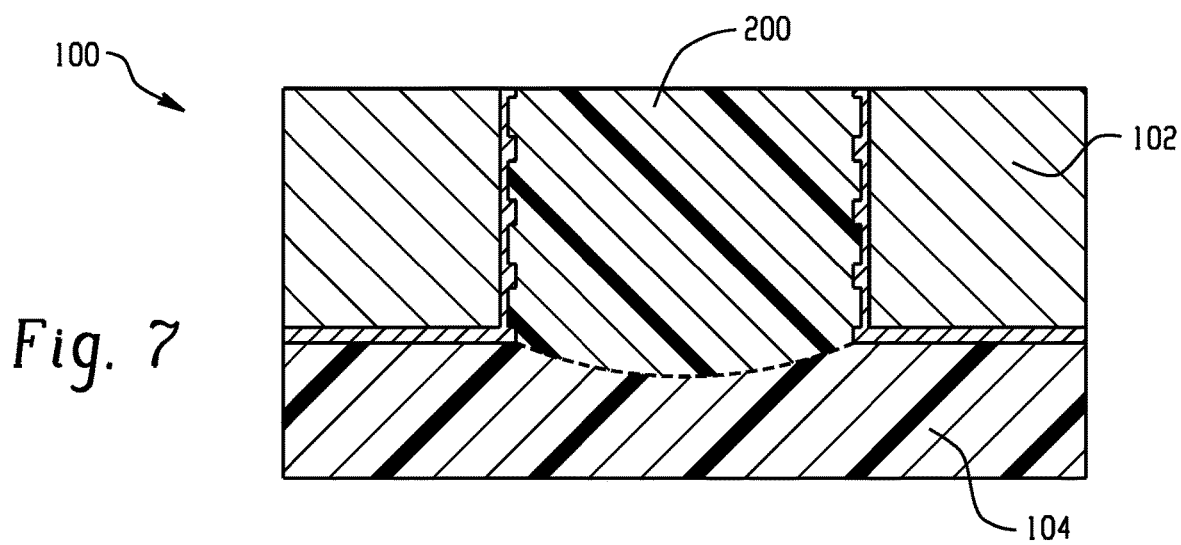
FIG. 7 depicts a cross section of the structure of FIG. 6 subsequent to refill with a second dielectric material in accordance with one or more embodiments of the present invention.
Figure 8:
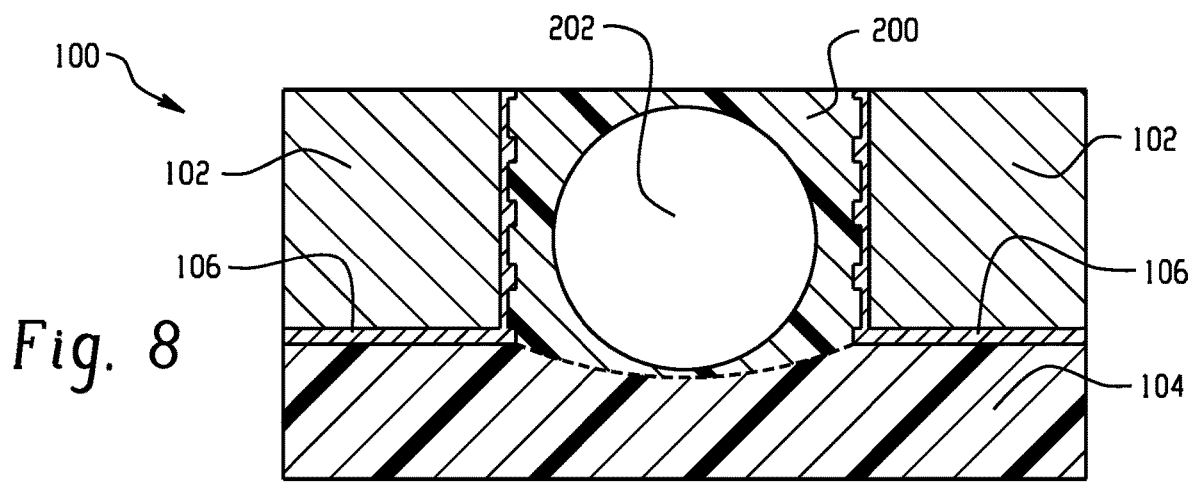
FIG. 8 depicts a cross section of the structure of FIG. 6 subsequent to refill with a second dielectric material to form an air gap therein in accordance with one or more embodiments of the present invention.

As shown in FIGS. 7-8, a second dielectric material 200 is deposited into the opening 114 between the adjacent conductors 102 formed by removal of the first dielectric layer 104. Once the second dielectric material 200 is deposited, a planarization process is used to planarize the top surface such that the top surface of the second dielectric material 200 is coplanar with the top surfaces of the adjacent conductors 102. As previously noted, the second dielectric material 200 is different from the first dielectric material 104. In one or more embodiments, the second dielectric material 200 is selected to have a lower dielectric constant than the first dielectric material 104. In one or more other embodiments, the second dielectric material 200 is selected to have a higher dielectric constant than the first dielectric material 104.

In FIG. 7, the second dielectric material 200 is deposited to uniformly fill the opening 114 between the adjacent conductors 102.

In FIG. 8, the second dielectric material 200 is deposited to fill the opening 114 and form an air gap 202 therein to achieve the lowest dielectric constant. between the adjacent conductors 102. The deposition of the second dielectric material 200 and the formation of air gaps 202 between adjacent patterned conductive copper materials 102, i.e., electrically conductive interconnect lines, can be controlled by the critical dimension space. For example, large spaces, e.g., spaces greater than 100 nm, can be filled with the dielectric material to provide effective mechanical strength whereas small spaces, e.g., spaces smaller than 50 nm, can be defined by an air gap to improve RC delay and reliability. The particular spaces to be filled or provided with an airgap are not intended to be limited and will generally depend on the deposition process and materials used.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A back end of line (BEOL) structure comprising:
at least two adjacent conductors separated by a space formed in a first dielectric material, wherein a liner layer is intermediate the first dielectric material and each of the at least two adjacent conductors;
a second dielectric material in the space between the at least two adjacent conductors and in contact with the first dielectric material at a bottom surface thereof, wherein the first dielectric material is different from the second dielectric material; and
a nitrogen enriched surface comprising a first portion at an interface between the first dielectric material and the second dielectric material and a second portion that extends from the first portion along an entire length of opposite sidewalls of the liner layer to a top surface of the liner layer.

2. The BEOL structure of claim 1, wherein the first dielectric material has a dielectric constant greater than the second dielectric material.

3. The BEOL structure of claim 1, wherein the first dielectric material has a dielectric constant less than the second dielectric material.

4. The BEOL structure of claim 1, wherein the second dielectric material uniformly fills the space between the at least two adjacent conductors.

5. The BEOL structure of claim 1, wherein the second dielectric material provides an air gap within the space between the at least two adjacent conductors.

6. The BEOL structure of claim 1, wherein each of the at least two adjacent conductors comprises a top surface free of nitrogen enrichment.

7. The BEOL structure of claim 1, wherein the liner layer comprises a surface abutting the space between the at least two adjacent conductors that is free of nitrogen enrichment.

8. A back end of line (BEOL) dielectric removal and refill process between adjacent conductors, the process comprising:
removing a first dielectric material between adjacent conductors to form an opening exposing liner layers on sidewalls of the adjacent conductors and the first dielectric material at a bottom of the opening;
nitridizing exposed top surfaces of the adjacent conductors, the exposed liner layer on the sidewalls of the adjacent conductor, and the exposed first dielectric material at the bottom of the opening to form nitrogen enriched surfaces;
selectively removing the nitrogen enriched surface on the top surfaces of the adjacent conductors; and
filling the opening between the adjacent conductors with a second dielectric material, wherein the first dielectric material is different from the second dielectric material.

9. The BEOL process of claim 8, wherein removing a first dielectric material between adjacent conductors increases surface roughness of the exposed liner layer on the sidewalls of the adjacent conductors, and the first dielectric material at the bottom of the opening.

10. The BEOL process of claim 8, wherein filling the opening between the adjacent conductors with a second dielectric material forms an air gap.

11. The BEOL process of claim 8 further comprising selectively removing the nitrogen enriched surfaces from the liner layer.

12. The BEOL process of claim 11, wherein selectively removing the nitrogen enriched surfaces from the liner layer comprises exposing the liner layer to a hydrogen containing plasma.

13. The BEOL process of claim 8, wherein nitridizing the exposed top surfaces of the adjacent conductors, the exposed liner layer on the sidewalls of the adjacent conductor and the exposed first dielectric material at the bottom of the opening to form nitrogen enriched surfaces comprises thermal nitridation, plasma nitridation, or laser anneal of nitrogen gas, ammonia or a combination thereof to generate nitrogen ions.

14. The BEOL process of claim 8, wherein filling the opening between the adjacent conductors with the second dielectric material is uniform.

15. The BEOL process of claim 8, wherein the first dielectric material has a dielectric constant greater than the second dielectric material.

16. The BEOL process of claim 8, wherein the first dielectric material has a dielectric constant less than the second dielectric material.

17. A back end of line (BEOL) dielectric removal and refill process between adjacent conductors, the process comprising:
removing a first dielectric material between at least two adjacent conductors to form an opening therebetween exposing liner layers on sidewalls of the adjacent conductors and the first dielectric material at a bottom of the opening;
nitridizing exposed top surfaces of the at least two adjacent conductors, the exposed surfaces of the liner layer on the sidewalls abutting the opening, and the exposed surfaces of the first dielectric material at the bottom of the opening to form nitrogen enriched surfaces;
selectively removing the nitrogen enriched surfaces on the exposed top surfaces of the at least two adjacent conductors and the exposed surfaces of the liner layer by exposure to a reactive pre-clean process; and
filling the opening between the adjacent conductors with a second dielectric material, wherein the nitrogen enriched surfaces of the first dielectric material are in contact with the second dielectric material, and wherein the first dielectric material is different from the second dielectric material.

18. The BEOL process of claim 17, wherein the reactive pre-clean process comprises exposing the top surfaces of the at least two adjacent conductors and the exposed surfaces of the liner layer to a hydrogen containing plasma.

19. The BEOL process of claim 17, wherein the first dielectric material has a dielectric constant greater than the second dielectric material.

20. The BEOL process of claim 17, wherein nitridizing the exposed top surfaces of the adjacent conductors, the exposed liner layer on the sidewalls of the adjacent conductor and the exposed first dielectric material at the bottom of the opening to form nitrogen enriched surfaces comprises thermal nitridation, plasma nitridation, or laser anneal of nitrogen gas, ammonia or a combination thereof to generate nitrogen ions.

* * * * *